United States Patent
Carlo et al.

(10) Patent No.: US 12,248,025 B2
(45) Date of Patent: *Mar. 11, 2025

(54) BATTERY TEST SYSTEM WITH CAMERA

(71) Applicant: CPS Technology Holdings LLC, New York, NY (US)

(72) Inventors: Michael R. Carlo, Sussex, WI (US); Dale A. Gospodarek, Kenosha, WI (US)

(73) Assignee: CPS Technology Holdings LLC, New York, NY (US)

(*) Notice: Subject to any disclaimer, the term of this patent is extended or adjusted under 35 U.S.C. 154(b) by 0 days.

This patent is subject to a terminal disclaimer.

(21) Appl. No.: 17/994,823

(22) Filed: Nov. 28, 2022

(65) Prior Publication Data

US 2023/0087692 A1  Mar. 23, 2023

Related U.S. Application Data

(63) Continuation of application No. 17/065,126, filed on Oct. 7, 2020, now Pat. No. 11,519,967, which is a
(Continued)

(51) Int. Cl.
  *G01R 31/385* (2019.01)
  *G01R 31/367* (2019.01)
  (Continued)

(52) U.S. Cl.
  CPC ......... *G01R 31/385* (2019.01); *G01R 31/367* (2019.01); *G01R 31/378* (2019.01);
  (Continued)

(58) Field of Classification Search
  CPC .. G01R 31/367; G01R 31/378; G01R 31/385; G06F 18/22; G06V 20/63; G06V 20/625; G06V 30/224
  See application file for complete search history.

(56) References Cited

U.S. PATENT DOCUMENTS 4,855,770 A  8/1989  Mauchan et al.
6,051,976 A  4/2000  Bertness
(Continued)

FOREIGN PATENT DOCUMENTS

CN  103149212 A  6/2013
JP  2013076570    4/2013
WO  2016144496    9/2016

OTHER PUBLICATIONS

Spectro CA12 DC for Deep Cycle Lead Acid Batteries, Cadex. Electronics, Dec. 15, 2015, pp. 1-6; http://www.cadex.com/en/products/spectroca 12dc.
(Continued)

*Primary Examiner* — Richard Isla
*Assistant Examiner* — Johali A Torres Ruiz
(74) *Attorney, Agent, or Firm* — Boardman & Clark LLC

(57) ABSTRACT

The present disclosure relates to a battery test system for a vehicle that includes a camera configured to capture an image of a vehicle identification number located on the vehicle, the camera being coupled to a processor which determines characters of the vehicle identification number from the image of the camera and correlates the characters of the vehicle identification number to a vehicle identification number database to receive battery parameters for the vehicle, a battery tester that is removably connected to terminals of a battery of the vehicle and configured to receive battery test results, and a display which conveys information relating to the battery parameters and the battery test results.

20 Claims, 6 Drawing Sheets

Related U.S. Application Data continuation of application No. 15/013,794, filed on Feb. 2, 2016, now Pat. No. 10,816,605.

(60) Provisional application No. 62/131,714, filed on Mar. 11, 2015.

(51) Int. Cl.
  *G01R 31/378* (2019.01)
  *G06F 18/22* (2023.01)
  *G06V 20/62* (2022.01)
  *G06V 30/224* (2022.01)

(52) U.S. Cl.
  CPC .............. *G06F 18/22* (2023.01); *G06V 20/63* (2022.01); *G06V 30/224* (2022.01)

(56) References Cited

U.S. PATENT DOCUMENTS

| | | | |
|---|---|---|---|
| 6,871,151 | B2 | 3/2005 | Bertness |
| 7,129,706 | B2 | 10/2006 | Kalley |
| 7,899,256 | B2 | 3/2011 | Fedorovskaya et al. |
| 8,344,685 | B2 | 1/2013 | Bertness et al. |
| 8,515,865 | B1 | 8/2013 | Marathe |
| 10,816,605 | B2 | 10/2020 | Carlo et al. |
| 11,519,967 | B2 | 12/2022 | Carlo et al. |
| 2004/0051533 | A1 | 3/2004 | Namaky |
| 2004/0251907 | A1* | 12/2004 | Kalley ................... G01R 31/36 324/426 |
| 2010/0204876 | A1 | 8/2010 | Comeau et al. |
| 2012/0119747 | A1* | 5/2012 | Sauerwine ......... G01R 31/3835 324/432 |
| 2012/0182132 | A1 | 7/2012 | McShane et al. |
| 2013/0029735 | A1 | 1/2013 | Celolla |
| 2013/0290036 | A1 | 10/2013 | Strange |
| 2013/0297353 | A1 | 11/2013 | Strange |
| 2014/0082017 | A1* | 3/2014 | Miller .................. G06Q 10/087 707/770 |
| 2014/0156272 | A1 | 6/2014 | Sieger et al. |
| 2014/0324275 | A1* | 10/2014 | Stanek ................... G07C 5/008 701/31.4 |
| 2014/0374475 | A1* | 12/2014 | Kallfelz ............ H01M 10/4285 235/375 |
| 2015/0039176 | A1 | 2/2015 | Fish |
| 2015/0106010 | A1 | 4/2015 | Martin et al. |
| 2016/0335816 | A1* | 11/2016 | Thoppae ............... G07C 5/0841 |

OTHER PUBLICATIONS

JP 2017-547465 Office Action dated Jun. 18, 2019.
International Search Report and Written Opinion dated Jun. 17, 2016 for PCT/US2016/018436.

* cited by examiner

BATTERY TEST SYSTEM WITH CAMERA

CROSS-REFERENCE TO RELATED APPLICATIONS:

This application is a continuation of U.S. patent application Ser. No. 17/065,126, filed Oct. 7, 2020, entitled "BATTERY TEST SYSTEM WITH CAMERA", now U.S. Pat. No. 11,519,967, which claims priority from U.S. patent application Ser. No. 15/013,794, filed Feb. 2, 2016, entitled "BATTERY TEST SYSTEM WITH CAMERA", now U.S. Pat. No. 10,816,605, which claims priority from and the benefit of U.S. Provisional Application No. 62/131,714, filed Mar. 11, 2015, entitled "BATTERY COLD CRANKING AMPS IDENTIFIER FROM VEHICLE IDENTIFICATION NUMBER (VIN)," both of which are hereby incorporated by reference in their entireties for all purposes.

BACKGROUND

The present disclosure relates generally to an automotive battery test system that includes a camera.

This section is intended to introduce the reader to various aspects of art that may be related to various aspects of the present disclosure, which are described below. This discussion is believed to be helpful in providing the reader with background information to facilitate a better understanding of the various aspects of the present disclosure. Accordingly, it should be understood that these statements are to be read in this light, and not as admissions of prior art.

It may be desirable to test batteries to determine a condition (e.g., a health) of a tested battery. For example, battery test systems may be coupled to a battery and configured to provide information related to the health of the battery. In some cases, a tester (e.g., an operator performing the test) may input information specific to the battery undergoing the test. Unfortunately, determining and inputting such information into a test device may be time consuming and/or may be performed inaccurately.

SUMMARY

A summary of certain embodiments disclosed herein is set forth below. It should be understood that these aspects are presented merely to provide the reader with a brief summary of certain embodiments and that these aspects are not intended to limit the scope of this disclosure. Indeed, this disclosure may encompass a variety of aspects that may not be set forth below.

The present disclosure relates to a battery test system for a vehicle that includes a camera configured to capture an image of a vehicle identification number located on the vehicle, the camera being coupled to a processor which determines characters of the vehicle identification number from the image of the camera and correlates the characters of the vehicle identification number to a vehicle identification number database to receive battery parameters for the vehicle, a battery tester that is removably connected to terminals of a battery of the vehicle and configured to receive battery test results, and a display which conveys information relating to the battery parameters and the battery test results.

The present disclosure also relates to a method of testing a battery for a vehicle that includes capturing an image of a vehicle identification number of the vehicle using a camera, processing the image of the vehicle identification number to determine characters of the vehicle identification number, comparing the characters of the vehicle identification number to a vehicle identification number database to determine battery parameters of the vehicle, testing the battery to determine battery test results, and displaying the battery test results and the battery parameters.

DRAWINGS

Various aspects of this disclosure may be better understood upon reading the following detailed description and upon reference to the drawings in which.

Figure 2:
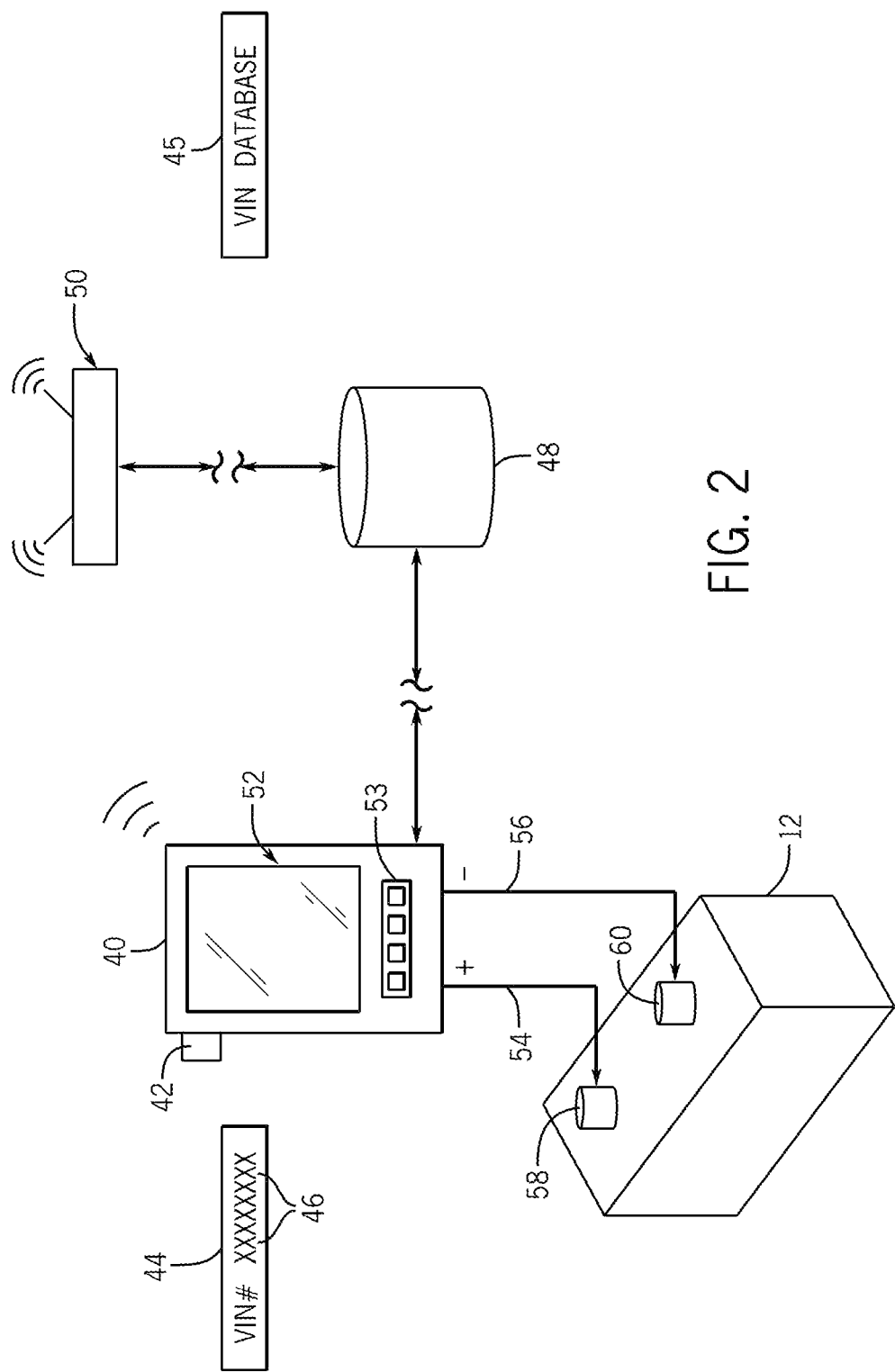
FIG. 2 is a schematic of an embodiment of a battery test system that may be utilized to capture an image of a vehicle identification number and test the battery of FIG. 1, in accordance with an aspect of the present disclosure.
Figure 3:
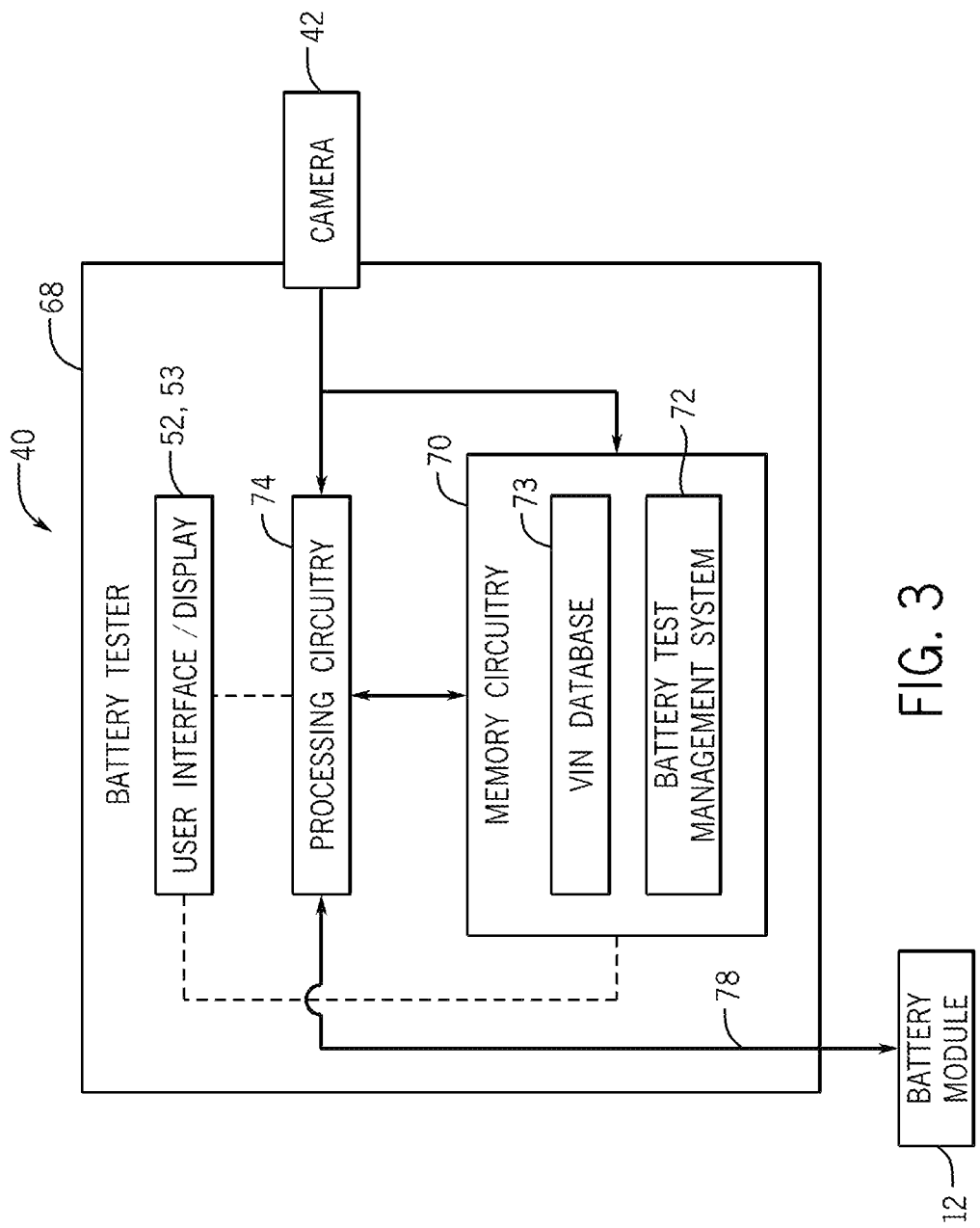
FIG. 3 is a block diagram of an embodiment of the battery test system of FIG. 2 having an internal vehicle identification number database, in accordance with an aspect of the present disclosure.
Figure 4:
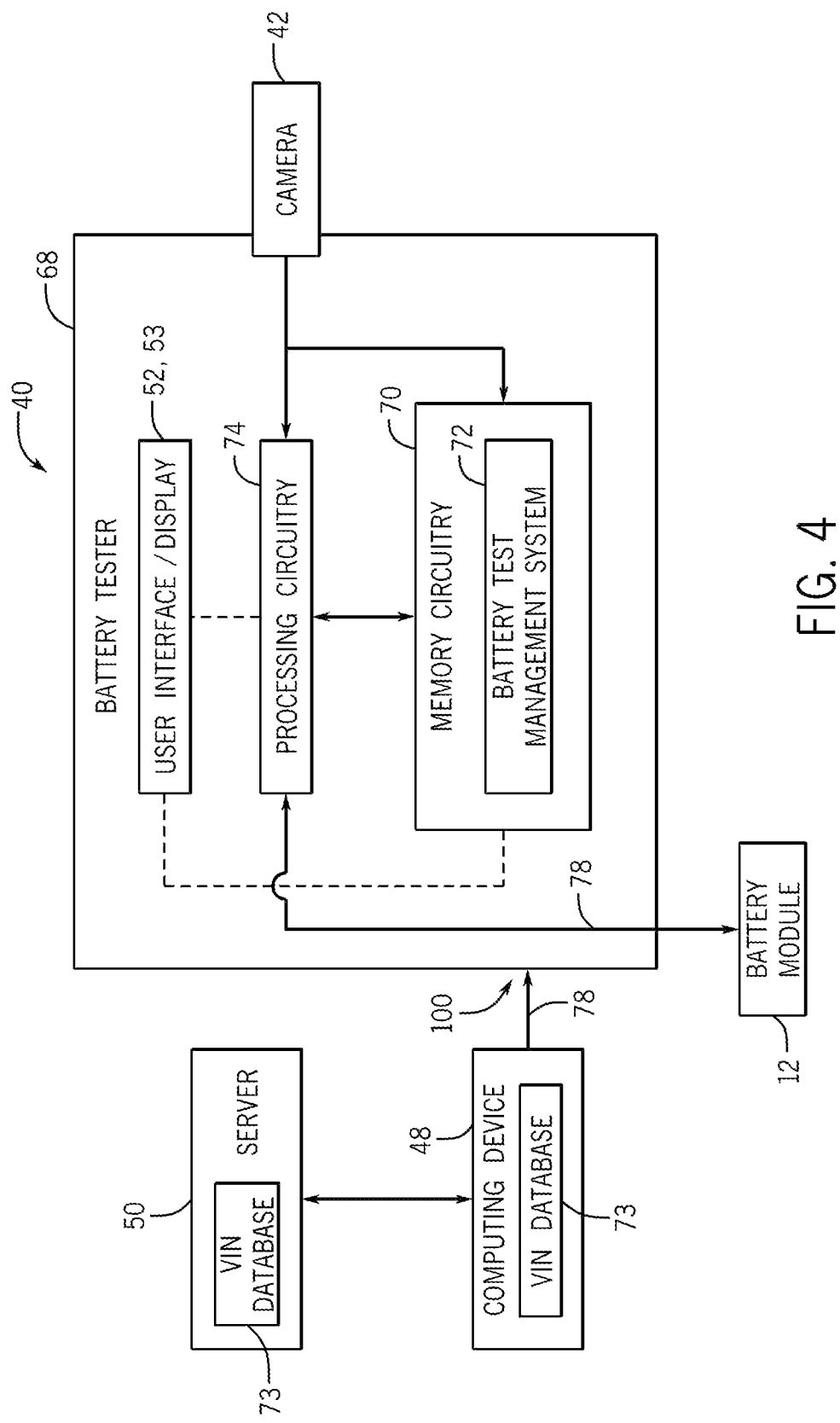
FIG. 4 is a block diagram of an embodiment of the battery test system of FIGS. 2 and 3 that utilizes an external vehicle identification number database, in accordance with an aspect of the present disclosure.
Figure 5:
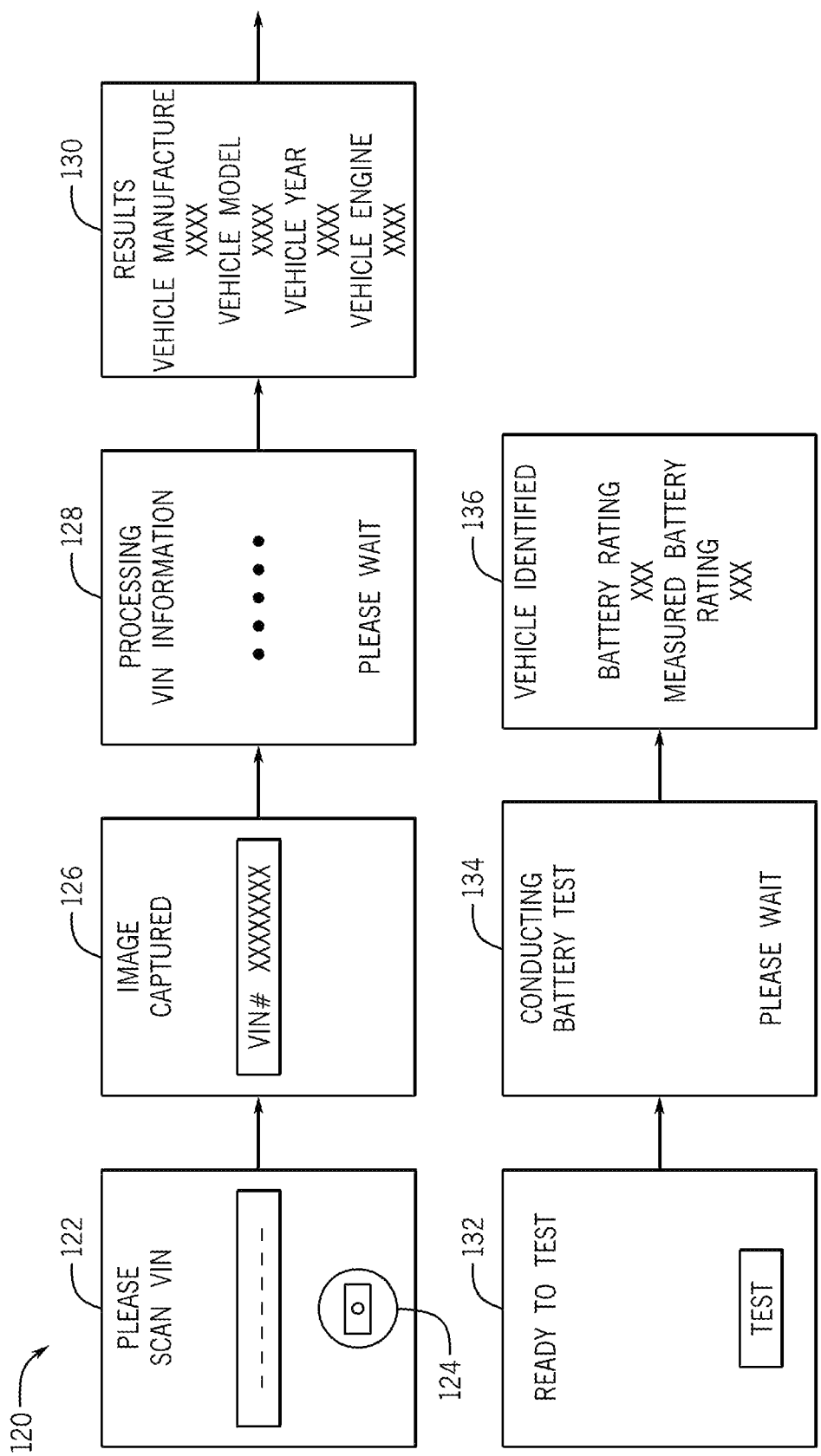
Figure 6:
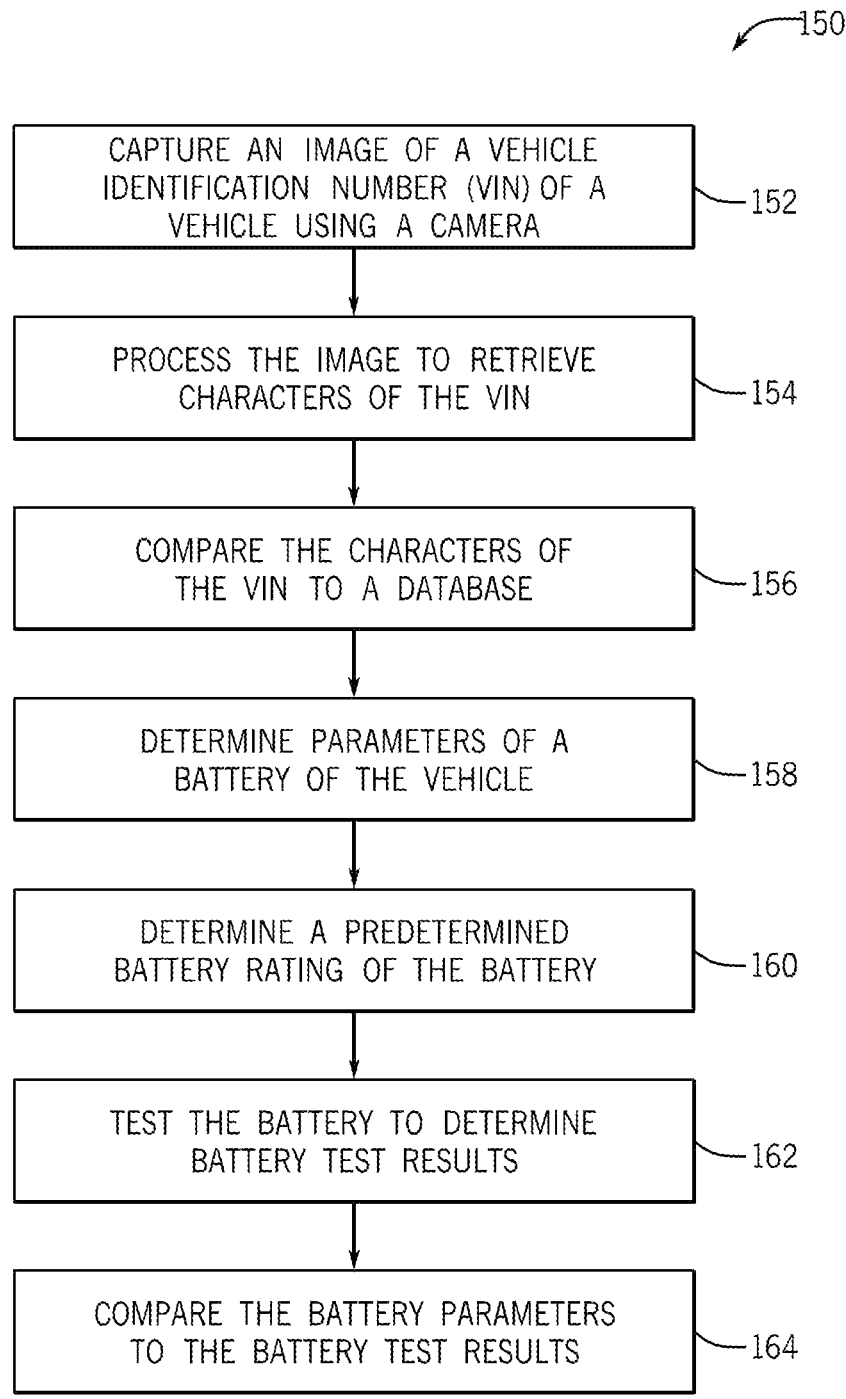

FIG. 5 is a block diagram of a flow chart of embodiments of a display of the battery test system of FIGS. 2-4 throughout a battery test, in accordance with an aspect of the present disclosure; and FIG. 6 is a block diagram of a method that may be performed by the battery test system of FIGS. 2-5 to collect battery test parameters and conduct a battery test, in accordance with an aspect of the present disclosure.

DETAILED DESCRIPTION

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Although advancements in battery technology continue to prolong life spans of batteries, the operating life of a battery is finite. Accordingly, battery test systems may be utilized to determine an operating status (e.g., health) of a battery, thereby providing a vehicle owner with an indication as to how much longer the battery may continue to provide sufficient power to the vehicle (or vehicle components). Battery test systems may include coupling devices that establish an electrical connection with a battery (e.g., via terminals of the battery), such that the battery test system may determine various parameters (e.g., original equipment manufacturer (OEM) battery parameters) of the battery. In some cases, the tester (e.g., an operator performing the test) may be prompted to input information regarding the vehicle and/or the battery. However, a battery may be located under a hood of the vehicle, in a trunk of the vehicle, under a seat of the vehicle, secured within the vehicle using a fastening device (e.g., a mounting bracket), or otherwise positioned in the vehicle such that at least a portion of the battery may not be visible without disassembling a component of the vehicle (e.g., the fastening device). Additionally, manually inputting vehicle and/or battery information may be time consuming and subject to inadvertent error.

It is now recognized that it may be desirable to automatically retrieve vehicle and/or battery information without physically viewing or contacting the battery and without manually inputting battery parameters (e.g., original equipment manufacturer parameters, cold cranking amps (CCA), cranking amps (CA), and/or another battery rating) into the battery test system. In accordance with embodiments of the present disclosure, a battery test system may include a camera that may be utilized to capture an image of a vehicle identification number (VIN). The VIN may be a unique set of characters (e.g., letters and numerals) used to identify a particular vehicle. Additionally, the VIN may include information specific to the particular vehicle in which it resides. For example, the VIN may specify a manufacturer of the vehicle (e.g., make), a manufacture location, a model of the vehicle, a body style of the vehicle, a type of vehicle, an engine type of the vehicle, a year of manufacture, and/or information related to vehicle components (e.g., the battery).

A battery test system that captures the VIN of a vehicle may retrieve information that enables the battery test system to automatically retrieve battery parameters (e.g., original equipment manufacturer battery parameters) and compare the battery parameters with battery test results. For example, the battery test system may be configured to compare the captured VIN to a VIN database, which may provide the battery parameters specific to the battery of the vehicle associated with the captured VIN. Such battery parameters may include minimum battery performance criteria specified by an Original Equipment Manufacturer (OEM) of the battery, for example. Accordingly, the battery parameters may be automatically input into the battery test system, and the battery test may be performed to compare the battery test results to the battery parameters. Such a battery test system may determine the battery parameters quickly and accurately, thereby enabling a tester to perform battery tests with enhanced efficiently.

Figure 1:
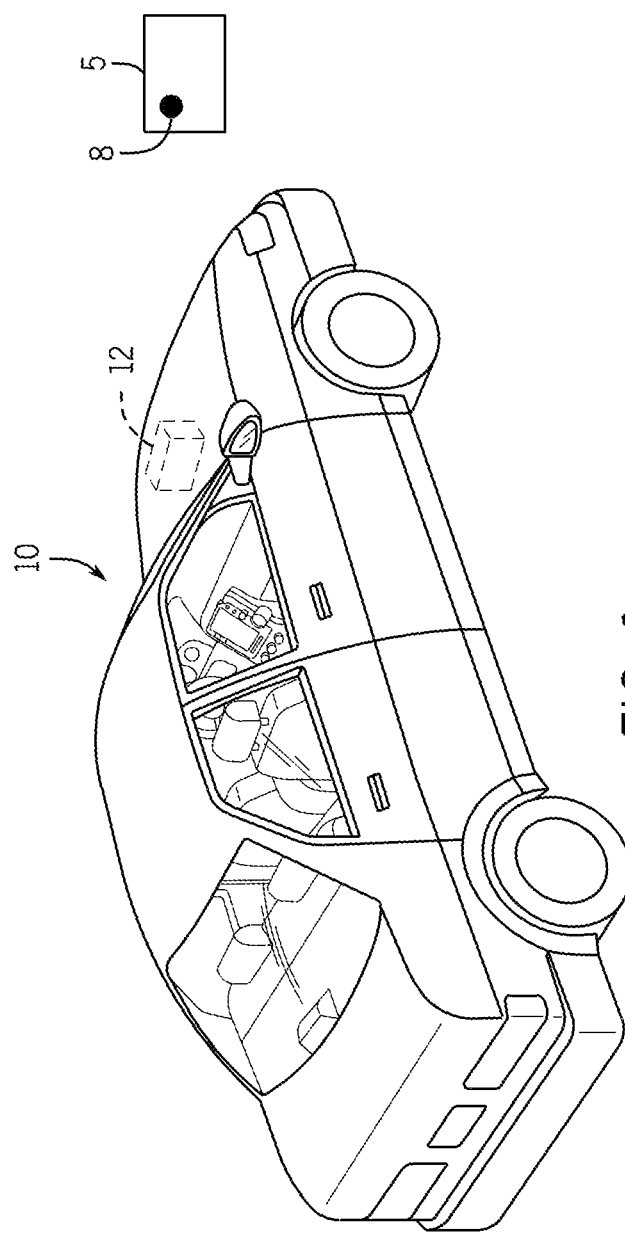
FIG. 1 is a perspective view of a vehicle having a battery to provide power for various components of the vehicle, in accordance with an aspect of the present disclosure.

To help illustrate the manner in which the present embodiments may be used in a system, FIG. 1 is a perspective view of an embodiment of a battery test system 5 with a camera 8 being utilized with a vehicle 10. As shown in the illustrated embodiment of FIG. 1, the vehicle includes a battery 12. The battery 12 may be placed under the hood of the vehicle 10 (e.g., as illustrated), in a trunk of the vehicle, under a seat of the vehicle, secured within the vehicle using a fastening device (e.g., a mounting bracket), or otherwise positioned in the vehicle such that at least a portion of the battery may not be visible without disassembling a component of the vehicle (e.g., the fastening device). In certain embodiments, the battery 12 may be a lead-acid battery.

In some embodiments, the battery 12 may supply power to components of the vehicle's electrical system, which may include radiator cooling fans, climate control systems, electric power steering systems, active suspension systems, auto park systems, electric oil pumps, electric super/turbochargers, electric water pumps, heated windscreen/defrosters, window lift motors, vanity lights, tire pressure monitoring systems, sunroof motor controls, power seats, alarm systems, infotainment systems, navigation features, lane departure warning systems, electric parking brakes, external lights, or any combination thereof.

As discussed above, the battery 12 may be subject to a finite operating life, such that it may be desirable to test the battery 12 to obtain an indication as to how much longer the battery 12 may operate at a predetermined level. For example, a battery test system 5 may be utilized to indicate a status or health of the battery 12 (e.g., by comparing battery parameters to battery test results). In some cases, at least a portion of the battery 12 may not be visible to a tester (e.g., an operator performing the test) and/or the tester may input parameters of the battery 12 into the battery test system 5 incorrectly. Accordingly, it is now recognized that the battery test system 5 may include a camera 8 that may be utilized to capture a vehicle identification number (VIN) of the vehicle 10 associated with the battery 12 to be tested.

For example, FIG. 2 is a schematic of an embodiment of a battery test system 40 that may be utilized to capture an image of a vehicle's VIN 44. As shown in the illustrated embodiment, the battery test system 40 may include a camera 42 that may capture (and process) the VIN 44 to determine properties of the vehicle 10 (e.g., the battery). The camera 42 may be any optical device that may store and/or transmit a recorded image (e.g., the VIN 44). For example, the camera 42 may include a digital camera that may capture the recorded image (e.g., the VIN 44), transmit the recorded image, process the recorded image, and/or store the recorded image for later reproduction.

In some embodiments, the VIN 44 may be a simple bar code that includes a series of characters 46 (e.g., letters and numerals) that are unique to the vehicle 10 of the battery 12 to be tested. In some embodiments, the characters 46 may also be indicative of vehicle information such as a manufacturer of the vehicle (e.g., make), a manufacture location, a model of the vehicle, a body style of the vehicle, a type of vehicle, an engine type of the vehicle, a year of manufacture, and/or information related to vehicle components (e.g., the battery). In other embodiments, the VIN 44 may be a two-dimensional code (e.g., a Quick Response (QR) code or another unique identifier) that may also be indicative of the battery parameters (e.g., cold cranking amps (CCA), cranking amps (CA), and/or another battery rating) unique to the battery 12 of the particular vehicle 10.

In any case, the VIN 44 may be positioned in an easily accessible location of the vehicle 10. For example, in some embodiments, the VIN 44 may be positioned on an inner surface of a driver's side door of the vehicle 10, such that a tester may easily view, access, scan, and/or photograph the VIN 44 when the driver's side door is in an open position. In other embodiments, the VIN 44 may be positioned on a windshield of the vehicle 10 or in another easily viewable and/or accessible location of the vehicle 10, such that a tester may capture the VIN 44 using the camera 42 of the battery test system 40. As discussed in detail, below, the battery test system 40 may be configured to process (e.g., decode and/or decipher) the image of the captured VIN 44 and utilize (e.g., store) battery parameters specific to the battery 12 (e.g., CCA, CA, and/or another battery rating) determined from the captured image of the VIN 44.

In some embodiments, the battery test system 40 may include a VIN database 45 that is local and may enable the battery test system 40 to determine the test parameters from the VIN 44 without communicating with an external device. In other embodiments, the battery test system 40 may be coupled to an external computing device 48, which may include the VIN database 45. In still further embodiments, the external computing device 48 and/or the battery test system 40 may be configured to wirelessly communicate with a server 50 (e.g., a second computing device or a "cloud") that includes the VIN database 45. In any case, the battery test system 40 may capture and process the VIN 44 from the vehicle 10 and acquire test parameters via the VIN database 45 (e.g., comparing at least one character of the VIN 44 to predetermined characters in the VIN database 45).

In the illustrated embodiment of FIG. 2, the battery test system 40 also includes a display 52. The display 52 may provide a visual output that may be viewed by the tester (e.g., the operator performing the battery test). In certain embodiments, the display 52 may be a touch screen, such that the tester may manually input battery parameters, manually correct battery parameters, or initiate a function of the battery test system 40 (e.g., the battery test), if desired. In other embodiments, the battery test system 40 may include a user interface 53 separate from the display 52, where the user interface 53 may enable the tester to manually input parameters and/or initiate a function (e.g., the battery test). For example, the user interface 53 (e.g., separate from the display 52) may include one or more buttons, knobs and/or other manual control devices.

Additionally, the battery test system 40 may include a first coupling feature 54 and a second coupling feature 56 that may be used to establish communication between the battery test system 40 and the battery 12. For example, the first coupling feature 54 may be electrically coupled to a first terminal 58 (e.g., a positive terminal) of the battery 12, and the second coupling feature 56 may be electrically coupled to a second terminal 60 (e.g., a negative terminal) of the battery 12. In certain embodiments, the first and/or second coupling features 54, 56 may include cables coupled to the battery test system 40 on a first end and coupled to a respective battery terminal 58 and/or 60 on a second end. The second end of the cable may terminate in a clamp that enables a removable connection between the battery test system 40 and the respective battery terminal 58, 60. The battery test system 40 may include a battery tester, which may include circuitry and other components that may enable the battery test system 40 to determine a status (e.g., battery test results) of the battery 12 by measuring a voltage, resistance, capacity, rating, and/or other parameters of the battery, for example.

In order to capture, process, store, and/or determine information from the VIN 44, the battery test system 40 may include several components. For example, FIG. 3 is a block diagram of an embodiment of the battery test system 40 in accordance with present embodiments. In the illustrated embodiment of FIG. 3, the battery test system 40 includes a casing 68 that may house a tangible, non-transitory computer readable medium 70 (e.g., memory circuitry and/or memory). Additionally, in some embodiments, the camera 42 may be at least partially disposed in the casing 68. The memory 70 may store a battery test management system 72 implemented as one or more sets of instructions (e.g., processor-executable instructions for performing a test). Additionally, in certain embodiments, the memory circuitry 70 may include a VIN database 73 (e.g., a local database) that may be used to determine vehicle and/or battery information associated with the VIN 44 captured from the vehicle 10. The battery test system 40 also includes one or more processors or processing circuitry 74 configured to execute the instructions included in the battery test management system 72 to perform certain routines and/or battery tests, among other functions. For example, the camera 42 may capture an image of the VIN 44 (or a portion of the VIN 44), which may be processed utilizing instructions of the battery test management system 72. In some embodiments, the instructions of the battery test management system 72 may be configured to perform optical character recognition (OCR). Accordingly, the battery test system 40 may convert an image of the VIN 44 (or a portion of the VIN 44) into machine-readable text (or another format that may be processed by a computing device) that may be utilized to determine one or more parameters for the battery test.

Once the associated image is processed (e.g., the characters of the VIN 44 are converted into machine-readable text), the VIN 44 may be processed (e.g., decoded and/or deciphered) using the VIN database 73 to determine information about the vehicle 10 and/or the battery 12, such that battery parameters may be acquired. It should be noted that, in other embodiments, the VIN database 73 may be external to the battery test system 40 (e.g., FIG. 4). In still further embodiments, the battery test system 40 may include a wireless communication device that may be configured to wirelessly communicate (e.g., via the Internet and/or a cellular network) with the VIN database 73 located on an external device (e.g., a server and/or a "cloud").

In certain embodiments, the one or more processors 74 may include one or more application specific integrated circuits (ASICs), one or more field programmable gate arrays (FPGAs), one or more general purpose processors, or any combination thereof. Additionally, the memory circuitry 70 may include volatile memory, such as random access memory (RAM), and/or non-volatile memory, such as read-only memory (ROM), optical drives, hard disc drives, or solid-state drives.

As discussed above, the battery test management system 72 may include certain sets of instructions that, when executed by the one or more processors 74, are configured to perform a battery test and determine a condition (e.g., battery test results) of the battery 12 (e.g., the battery test management system 72 may include the battery tester). In certain embodiments, the battery test management system 72 may be a group of processor-executable instructions produced in any appropriate programming platform, such as C++, Matlab, and so forth. The battery test management system 72 may be constructed, in some embodiments, to automatically run some or all routines associated with determining battery parameters and/or performing the battery test. For example, the battery test management system 72 may be configured to retrieve battery parameters when an image of the VIN 11 (or a portion of the VIN 44) is captured, automatically input the battery parameters, and/or run the battery test. Accordingly, the camera 42 may be coupled to the one or more processors 74 and/or the memory 70 such that images captured by the camera 42 may be processed and utilized to input the battery parameters.

The battery test system 40 may also include the user interface 53, which may include one or more devices communicatively coupled to the memory 70 and processor 74 to enable a user to provide input to the battery test system 40 and to enable the battery test system 40 to provide outputs to the user (e.g., via the display 52). The user interface 53 may enable a user or operator to manually input information via a keyboard, a touch screen, a keypad, and/or a microphone, for example. The manually entered data (e.g., battery parameters), may be utilized to generally control one or more aspects of the battery test management system 72 (e.g., initiate testing of a battery, initiate display of test outcome, and/or initiate validation). The user interface 53 may also provide user-perceivable indications relating to the operation of the battery test system 40, and more specifically provide outputs to the user related to the battery test results.

For example, the user interface 53 may include the display 52, which is configured to visually present information to the tester (e.g., battery parameters and/or battery test results). Outputs generated by the battery test management system 72 may be shown on the display 52. For example, the display 52 may be configured to display the VIN 44 (or portion of the VIN 44) upon capture by the camera 42, display battery parameters for a tester to inspect prior to running the battery tests, and/or display a condition of the battery 12 when the battery test is complete (e.g., battery test results). Additionally or alternatively, the user interface 53 may include one or more acoustic devices (e.g., speakers) configured to provide user-audible outputs relating to these aspects.

The battery test system 40 may also include a communication system 78 that enables the battery test system 40 to communicate with other devices, such as the battery 12 and/or an external computing device. For example, the communication system 78 may include the first and second coupling features 54 and 56 that enable the battery test system 40 to be coupled to the first and second terminals 58, 60 of the battery 12 (e.g., the communication system 78 may be coupled to the battery test management system 72 to form the battery tester). The communication system 78 (and/or the first and second coupling features 54, 56) may include voltage sensors, current sensors, a load circuit or load connectors, interface features configured to enable test data to be provided to other devices and/or users, and so forth. In some embodiments, the battery test system 40 may include a variety of hardware devices and, in some embodiments, associated code (e.g., drivers) stored on the memory 70 to enable the processor 74 to process inputs received at the communication system 78. Example hardware devices may include wireless transmission and receiving equipment (e.g., transceivers), general purpose ports (e.g., ports for networking connectors), special purpose ports (e.g., ports for battery test equipment), and so forth. Additionally, the communication system 78 may include a wireless communication device that may be configured to wirelessly communicate (e.g., via the Internet or a cellular network) with an external computing device that includes the VIM database 73.

FIG. 4 is a block diagram of an embodiment of the battery test system 40 that utilizes an external VIN database 73 (as compared to the local VIN database 73 shown in the embodiment of FIG. 3). In certain embodiments, the battery test system 40 may include one or more interfaces 100 (e.g., wired or wireless interfaces) that may enable a connection between the battery test system 40 and the external computing device 48. The external computing device 48 may be a general purpose computer that includes the VIN database 73 (e.g., saved and/or stored on a memory of the computing device 48). Accordingly, in some embodiments, the external computing device 48 may receive the image of the VIN 44 (or portion of the VIN 44) and process the image to determine the characters (e.g., letters and numerals) of the VIM 44. The external computing device 48 may also compare the processed VIN 44 to the VIM database 73 to determine information pertaining to the vehicle 10 and/or the battery 12. In other embodiments, the battery test system 40 may be configured to process the VIN 44 before a signal is sent to the external computing device 48.

In some embodiments, the VIN database 73 may not be located on the external computing device 48. For example, the VIN database 73 may be stored on the server 50. The external computing device 48 may be configured to communicate with the server 50 (e.g., via a wired connection and/or a wireless connection). Storing the VIN database 73 on the server 50 may enable the VIN database 73 to be continuously updated such that the VIN 44 of vehicles purchased relatively recently may be identified.

The display 52 may show a series of messages that indicate to the tester a progress of the battery test and/or prompt the tester to initiate a function (e.g., take a picture of the VIN 44). For example, FIG. 5 is a block diagram of a flow chart 120 of embodiments of messages that may be displayed by the battery test system 40. At block 122, the battery test system 40 may prompt the tester to direct a lens of the camera 42 toward the VIN 44 of the vehicle 10. As discussed above, the VIN 44 may be positioned in an accessible location of the vehicle 10, such that the tester may easily place the camera 42 proximate to (e.g., within 1 foot of) the VIN 44. In some embodiments, the tester may press a button 124 on the display 52 to capture the image of the VIN 44 (or a portion of the VIN 44). The button 124 may be an image on a touch screen or a button that the tester may manually depress to trigger the camera 42 to capture the image of the VIN 44. In other embodiments, the battery test system 40 may be configured to recognize the VIN 44 when the lens of the camera 42 is directed at the VIN 44 and automatically acquire the image of the VIN 44.

When the image of the VIN 44 has been captured, the display 52 may be configured to display a message indicating that the image has been taken successfully and/or display a copy of the image to the tester, as shown in block 126. In some embodiments, the battery test system 40 may prompt the tester to recapture the image of the VIN 44 when the captured image is insufficient for the processor 74 to recognize and process (e.g., decipher or decode) the characters of the VIN 44. In such cases, the battery test system 40 may return to block 122 to enable the tester to retake a picture of the VIN 44 (or a portion of the VIN 44).

When the image of the VIN 44 is sufficient, the battery test system 40 may process the image to determine the individual characters (e.g., letters and/or numerals) included in the VIN 44 (or the portion of the VIN 44), as shown in block 128. Additionally, the display 52 may show the image of the VIN 44 and the machine-readable text (or another format that may be processed by a computing device) associated with the characters of the VIN 44 (e.g., received from the processor 74). In such embodiments, the tester may be prompted to verify that the machine-readable text (or another format that may be processed by a computing device) acquired by the battery test system 40 matches the characters of the VIN 44.

In some embodiments, the battery test system 40 may be configured to further compare the characters of the VIN 44 to characters and/or VINs included in the VIN database 73 (e.g., a local VIN database stored in the memory 70 or an external VIN database). Accordingly, the battery test system 40 may determine information about the vehicle 10 and/or the battery 12 (e.g., battery parameters) when it matches the VIN 44 (or characters of the VIN 44) to a corresponding VIN (or characters of a VIN) in the VIN database 73. In some embodiments, the VIN database 73 may be configured to associate one or more characters of the VIN 44 with a particular aspect of the vehicle 10, For example, the first character or a first set of characters may represent the vehicle manufacturer, the second character or second set of characters may represent a second vehicle attribute, and so forth. In such embodiments, the VIN database 73 may associate characters of the VIN 44 with particular vehicle parameters and/or battery parameters (e.g., decode or decipher the VIN 44). In other embodiments, the VIN database 73 may include a plurality of VINs as well as information regarding each vehicle 10 associated with a particular VIN. Therefore, the battery test system 40 may match the characters of the VIN 44 to a VIN of the database to acquire the vehicle and/or battery information associated with that VIN 44. Additionally, in some embodiments, when the machine-readable text of the VIN 44 does not match the characters of the VIN 44, the battery test system 40 may be configured to compare the image of the VIN 44 to the VIN database 73 (or another database) that may include images of other VINs. Accordingly, the image of the TIN 44 may be compared to a plurality of images of VINs that include corresponding vehicle and/or battery information, such that the battery parameters for the battery 12 may be acquired.

When the battery test system 40 has determined the vehicle information and/or battery parameters, the display 52 may show the information to the tester for verification, as shown in block 130. In certain embodiments, the display 52 may show a manufacturer of the vehicle (e.g., make), a manufacture location, a model of the vehicle, a body style of the vehicle, a type of vehicle, an engine type of the vehicle, a year of manufacture, and/or information related to vehicle components (e.g., the battery). The tester may correct any information that may be incorrect. For example, the tester may notice that one or more of the parameters automatically entered are incorrect, and thus, the tester may manually override the incorrect information using the user interface 53. In some embodiments, the tester may process the VIN 44 a second time upon determination that one or more of the automatically entered parameters are incorrect. In certain embodiments, the tester may press a second button (not shown) to verify that information is accurate.

When the vehicle information and/or the battery parameters have been verified, the tester may direct the battery test system 40 to begin to test the battery 12 (e.g., using the battery tester). In some embodiments, identifying information may be input (or a manual bypass may be performed) before testing can proceed (e.g., a test cannot be run until identifying information has been collected). In the illustrated embodiment, at block 132 the battery test system 40 may prompt the tester to begin the test. Before beginning, the test, the tester may connect the communication system 78 (e.g., the first and second coupling features 54 and 56) to the battery 12 (e.g., the terminals 58, 60). In some embodiments, the battery test system 40 may be configured to perform a preliminary detection of an electrical connection with the battery 12 to ensure that the battery test will be conducted accurately. Accordingly, the battery test system 40 may be configured to determine whether the battery 12 is operating sufficiently by performing the test and comparing the battery parameters acquired from the VIN 44 to battery test results.

While the test is being performed by the battery tester, the battery test system 40 may display a message indicating that the test is being performed and informing the tester that the test is running (e.g., a message stating "Conducting Battery Test, Please Wait"), as shown in block 134. When the battery test is complete, the display 52 may be configured to show the results of the battery test and/or the battery parameters, as shown in block 136. For example, the battery test results may include a measured battery rating (e.g., cold cranking amps (CCA) and/or cranking amps (CA)) of the battery 12. Additionally, a predetermined battery rating (e.g., cold cranking amps (CCA) and/or cranking amps (CA)) may be a battery parameter of the battery parameters determined from the VIN 44 or based on the battery parameters determined from the VIN 44. Therefore, the battery test system 40 may display both the battery parameters (e.g., the predetermined battery rating) and the battery test results (e.g., the measured battery rating) such that the tester may compare the two numbers and assess whether the measured battery rating suggests that a new battery should be installed.

Additionally, in some embodiments, the battery test system 40 may be configured to compare the battery test results to results achieved by vehicles with similar VINs. The camera 42 may capture the image of the VIN 44, thereby providing the characters of the VIN 44 in machine-readable text (or another format that may be processed by a computing device). The processor 74 may utilize the VIN database 73 to retrieve battery test results performed on batteries of vehicles with VINs similar to the VIN 44 (or portion of the VIN 44) captured by the camera 42. Accordingly, the battery test system 40 may enable the tester to compare the results of the battery test to parameters determined by an original equipment manufacturer (e.g., the battery parameters) as well as to results acquired from tests run on similar batteries.

In order to perform the functions described above, the one or more processors 74 (and/or a processor of the computing device 48) may be configured to perform instructions stored on the battery test management system 72. For example, FIG. 6 is a block diagram of a method 150 that may be performed (e.g., by the one or more processors 74 and/or a processor of the external computing device 48) to collect battery parameters and conduct the battery test to determine a condition of the battery 12 (e.g., battery test results). At block 152, the camera 42 may be configured to capture an image of the VIN 44 of the vehicle 10. As discussed above, the tester may position a lens of the camera 42 proximate to the VIN 44 to capture the image, which may be reproduced on the display 52 of the battery test system 40.

At block 154, the one or more processors 74 (and/or the processor of the external computing device 48) may process the image of the VIN 44 (or portion of the VIN 44) to acquire one or more characters (e.g., letters and/or numerals). For example, the one or more processors 74 may be configured to detect and/or recognize the characters of the VIN 44 from the image. As discussed above, the battery test management system 72 may include instructions configured to perform optical character recognition (OCR) such that the image of the VIN 44 may be converted into machine-readable text (or another format that may be processed by a computing device). Accordingly, at block 156, the one or more processors 74 (and/or the processor of the external computing device 48) may compare the characters of the VIN 44 to the VIN database 73. As discussed above, the VIN database 73 may include vehicle information and/or battery parameters associated with all or a portion of the characters. Therefore, the characters of the VIN 44 may be matched to those in the VIN database 73 to determine the battery parameters, as shown in block 158. For example, the characters of the VIN 44 may enable the one or more processors 74 (and/or the process of the external computing device 48) to determine a predetermined battery rating (e.g., one of the battery parameters), as shown in block 160. In some embodiments, one or more of the characters of the VIN 44 may be related to the battery 12, thereby enabling the one or more processors 74 to determine the predetermined battery rating for the particular battery 12 being tested. In other embodiments, the characters 46 of the VIN 44 may directly correspond to the predetermined battery rating.

In some embodiments, the battery test system 40 may block the battery test from being initiated until the battery parameters are acquired and verified by the testers. Additionally, the battery test system 40 may be configured to provide a confidence level determination (e.g., based on a quality of the image of the VIN 44 and/or other parameters) indicative of an accuracy of the collected battery parameters.

The tester may be prompted to re-take an image of the VIN 44 if the confidence level is below a threshold level (e.g., below 50%). In some embodiments, the tester may perform a manual override to initiate the battery test even when some or all of the battery parameters are missing or include a low confidence level.

At block 162, the battery test system 40 may conduct the battery test to determine battery test results, which may include the measured battery rating. As discussed above, the battery test system 40 may be coupled to the battery 12 (e.g., the first and second battery terminals 58, 60) with the communication system 78 (e.g., the first and second coupling features 54 and 56). Accordingly, the battery tester may determine the battery test results (e.g., the measured battery rating, cold cranking amps, cranking amps, or another battery rating) based on information received from the battery 12. Accordingly, at block 164, the battery test system 40 may display the battery parameters (e.g., the predetermined battery rating) and the battery test results (e.g., the measured battery rating) such that the tester (or the vehicle owner) may compare the values and determine whether a new battery should be purchased and/or installed. Additionally, in some embodiments, the battery test system 40 may be configured to compare the battery parameters to the battery test results and provide the tester with an indication of the state of the battery 12. Further, the battery test system 40 may provide a recommendation as to whether the battery 12 should be replaced. The battery parameters (e.g., the measured battery rating) and the battery test results (e.g., the predetermined battery rating) are accurate and are determined quickly because the battery parameters are automatically input into the battery test system 40 based at least on the captured image of the VIN 44. Therefore, the tester may perform more battery tests with enhanced efficiency.

One or more of the disclosed embodiments, alone or in combination, may provide one or more technical effects useful in testing batteries. In general, embodiments of the present disclosure include an enhanced battery test system that includes a camera configured to capture an image of a VIN of a vehicle. The battery test system may be configured to process the VIN and determine one or more battery parameters based on the VIN and the battery associated with the VIN and/or accumulated test data related to a category associated with the VIN (e.g., a boat battery). Acquiring the battery parameters in such a manner may enable a faster and more accurate comparison between the battery parameters and the battery test results because the tester may not physically access the battery and/or manually enter battery parameters. Further, more useful and contextual information may be provided. The technical effects and technical problems in the specification are exemplary and are not limiting. It should be noted that the embodiments described in the specification may have other technical effects and can solve other technical problems.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

What is claimed is:

1. A battery test system for a vehicle having a battery and a vehicle identification number (VIN), the battery test system comprising:
   a housing with a memory disposed within;
   a coupling feature attached to the battery at a second end of the coupling feature;
   a camera coupled to the housing;
   a display coupled to the housing, with the display allowing for an initiation of battery test system functions;
   a communication system coupled to the housing for wireless communication with an external computing device; and
   a processor disposed in the housing and operatively connected to the camera, the display, the communication system, and the memory, with the processor configured to execute instructions in the battery test system to:
   cause the camera to capture an image by the battery test system, the image including the VIN of the vehicle;
   obtain a battery parameter set for the vehicle based on characters of the VIN correlating to one of a plurality of stored VINs;
   cause an acquisition of measured battery test results for the battery by the battery test system applying the coupling feature;
   obtain other measured battery test results achieved by vehicles having similar VINs;
   initiate by the battery test system a first comparison of the measured battery test results with the battery parameter set and initiate by the battery test system a second comparison of the measured battery test results to the other measured battery test results to provide an indication of a state of the battery; and
   cause the battery test system to convey an information relating to the state of the battery on the display.

2. The battery test system of claim 1, wherein the camera, the display, and the communication system are supported by the housing.

3. The battery test system of claim 1, wherein the memory is further configured to store a local VIN database comprising the plurality of stored VINs and a plurality of battery parameter sets, wherein each battery parameter set of the plurality of battery parameter sets corresponds to a respective stored VIN of the plurality of stored VINs.

4. The battery test system of claim 3, wherein obtaining the battery parameter set for the vehicle includes the memory being further configured to store the instructions that, when executed by the processor, cause the processor to initiate comparing the VIN with the plurality of stored VINs and selecting a respective battery parameter set of the plurality of battery parameter sets based on the characters of the VIN correlating to the one of the plurality of stored VINs.

5. The battery test system of claim 1, wherein the memory is further configured to store a local measured battery test results database comprising the plurality of stored VINs and a plurality of measured battery test results, wherein each measured battery test result of the plurality of measured battery test results corresponds to a stored VIN of the plurality of stored VINs.

6. The battery test system of claim 5, wherein obtaining the other measured battery test results includes the memory being further configured to store the instructions that, when executed by the processor, cause the processor to initiate comparing the VIN with the plurality of stored VINs, and selecting the other measured battery test results of the plurality of measured battery test results based on the characters of the VIN.

7. The battery test system of claim 3, wherein the external computing device is configured to store a second VIN database comprising a second plurality of stored VINs and a second plurality of battery parameter sets, wherein obtaining the battery parameter set for the vehicle includes the memory being further configured to store the instructions that, when executed by the processor, cause the processor to initiate communication of the VIN to the external computing device via the communication system, and initiate retrieving of the battery parameter set in response to the communication, and wherein the second VIN database includes the VIN database, the second plurality of stored VINs includes the plurality of stored VINs, and the second plurality of battery parameter sets includes the plurality of battery parameter sets.

8. The battery test system of claim 1, wherein the memory causes the processor to initiate the first comparison of the measured battery test results with the battery parameter set to provide a first indication of the state of the battery, and initiate the second comparison of the measured battery test results to the other measured battery test results to provide a further indication of the state of the battery.

9. The battery test system of claim 8, wherein the first comparison provides a first recommendation as to whether the battery should be replaced.

10. The battery test system of claim 8, wherein the second comparison provides a second recommendation as to whether the battery should be replaced.

11. The battery test system of claim 8, wherein the processor causes the display to convey information relating to the state of the battery based on the first comparison and the second comparison.

12. A battery test system for a vehicle having a battery and a vehicle identification, the battery test system comprising:
a housing with a memory disposed within;
a coupling feature attached to the battery at a second end;
a communication system coupled to the housing and to wirelessly communicate with an external computing device; and
a processor disposed in the housing and operatively connected to the communication system and the memory, with the processor configured to execute instructions to:
acquire the vehicle identification, and obtain a battery parameter set for the vehicle based on the vehicle identification correlating to one of a plurality of stored vehicle identifications;
cause the battery test system to acquire measured battery test results for the battery using the coupling feature;
obtain an another battery test parameter set achieved by vehicles having related vehicle identifications, including the another battery test parameter set being based on a measured battery test result by another vehicle having a related vehicle identification;
initiate the battery test system comparing the measured battery test results with the battery parameter set and initiate the battery test system comparing the measured battery test results to the another battery test parameter set to provide an indication of a state of the battery; and
cause the battery test system to convey the state of the battery on a display operatively connected to the processor.

13. The battery test system of claim 12, wherein the vehicle identification includes a vehicle identification number.

14. The battery test system of claim 12, further comprising a camera coupled to the housing and being operatively connected to the processor, with the memory further configured to store the instructions that, when executed by the processor, cause the processor to:
cause the camera to capture an image, the image including the vehicle identification; and
obtain the vehicle identification from the image.

15. The battery test system of claim 12, wherein the memory is further configured to store a local vehicle identification database comprising the plurality of stored vehicle identifications and a plurality of battery parameter sets, wherein each battery parameter set of the plurality of battery parameter sets corresponds to a respective stored vehicle identification of the plurality of stored vehicle identifications.

16. The battery test system of claim 15, wherein obtaining the battery parameter set for the vehicle includes the memory being further configured to store the instructions that, when executed by the processor, cause the processor to initiate comparing the vehicle identification with the plurality of stored vehicle identifications and selecting the battery parameter set of the plurality of battery parameter sets based on characters of the vehicle identification correlating to characters of the one of the plurality of stored vehicle identifications.

17. The battery test system of claim 16, wherein the external computing device is configured to store a second vehicle identification database comprising a second plurality of stored vehicle identifications and a second plurality of battery parameter sets, and wherein obtaining the battery parameter set for the vehicle includes the memory being further configured to store the instructions that, when executed by the processor, cause the processor to initiate communication of the vehicle identification to the external computing device via the communication system, and initiate retrieving of the battery parameter set in response to the communication; and
wherein the second vehicle identification database includes the local vehicle identification database, the second plurality of stored vehicle identifications includes the plurality of stored vehicle identifications, and the second plurality of battery parameter sets includes the plurality of battery parameter sets.

18. The battery test system of claim 17, wherein the external computing device is configured to store the second vehicle identification database comprising the second plurality of stored vehicle identifications and the second plurality of battery parameter sets, and wherein obtaining the another battery test parameter set includes the memory being further configured to store instructions that, when executed by the processor, cause the processor to initiate communication of the vehicle identification to the external computing device via the communication system, and initiate retrieving of the another battery test parameter set in response to the communication.

19. The battery test system of claim 12, further comprising the display coupled to the housing.

20. The battery test system of claim 19, wherein the memory causes the processor to initiate comparing the measured battery test results with the battery parameter set to provide the indication of the state of the battery and initiate comparing the measured battery test results to the another battery test parameter set to provide a further indication of the state of the battery, and wherein the memory is further configured to store the instructions that, when executed by the processor, cause the processor to cause the display to convey information relating to the state of the battery based on the comparing.

* * * * *